(12) United States Patent  
Yoshimura (10) Patent No.: US 12,209,313 B2  
(45) Date of Patent: Jan. 28, 2025

(54) METAL MEMBER AND PRODUCTION METHOD THEREFOR

(71) Applicants: NGK Electronics Devices, Inc., Mine (JP); NGK Insulators, Ltd., Nagoya (JP)

(72) Inventor: Shigeru Yoshimura, Shimonoseki (JP)

(73) Assignees: NGK ELECTRONICS DEVICES, INC., Mine (JP); NGK INSULATORS, LTD., Nagoya (JP)

(*) Notice: Subject to any disclaimer, the term of this patent is extended or adjusted under 35 U.S.C. 154(b) by 455 days.

(21) Appl. No.: 17/447,322

(22) Filed: Sep. 10, 2021

(65) Prior Publication Data

US 2021/0404066 A1 Dec. 30, 2021

Related U.S. Application Data

(63) Continuation of application No. PCT/JP2020/011899, filed on Mar. 18, 2020.

(30) Foreign Application Priority Data

Apr. 22, 2019 (JP) .................. 2019-080858

(51) Int. Cl.
*H01L 21/48* (2006.01)
*C23C 18/16* (2006.01)
(Continued)

(52) U.S. Cl.
CPC ...... *C23C 18/1651* (2013.01); *C23C 18/1637* (2013.01); *C23C 18/32* (2013.01);
(Continued)

(58) Field of Classification Search
CPC ...... H01L 23/04; H01L 23/14; H01L 23/4871
See application file for complete search history.

(56) References Cited

U.S. PATENT DOCUMENTS 6,335,107 B1 1/2002 Abys et al.
2006/0231931 A1 10/2006 Kang et al.

FOREIGN PATENT DOCUMENTS

JP H06-302740 A 10/1994
JP 2001-152385 A 6/2001
(Continued)

OTHER PUBLICATIONS

English Translation of Kidoguchi—JP2018022817A, obtained form EPO espacenet Dec. 3, 2023 (Year: 2023).*

(Continued)

*Primary Examiner* — Adam Krupicka
(74) *Attorney, Agent, or Firm* — BURR PATENT LAW, PLLC (57) ABSTRACT

A metal member includes a metal substrate, a first intermediate plating layer, a second intermediate plating layer, and a precious metal plating layer. The metal substrate includes a surface constituted of a plurality of crystal grains. The first intermediate plating layer is directly formed on the plurality of crystal grains of the metal substrate, contains a nickel element, and is non-oriented with respect to each crystal orientation of the plurality of crystal grains of the metal substrate. The second intermediate plating layer is directly formed on the first intermediate plating layer. The precious metal plating layer is formed on the second intermediate plating layer.

14 Claims, 9 Drawing Sheets

(51) Int. Cl.
  *C23C 18/32*  (2006.01)
  *C23C 18/42*  (2006.01)
  *C23C 18/50*  (2006.01)
  *H01L 23/14*  (2006.01)
  *H01L 23/373*  (2006.01)

(52) U.S. Cl.
  CPC .............. *C23C 18/42* (2013.01); *C23C 18/50* (2013.01); *H01L 21/4871* (2013.01); *H01L 23/14* (2013.01); *H01L 23/3736* (2013.01)

(56) References Cited

FOREIGN PATENT DOCUMENTS

| | | |
|---|---|---|
| JP | 2006-303492 A | 11/2006 |
| JP | 2007-243145 A | 9/2007 |
| JP | 2015-030892 A | 2/2015 |
| JP | 2018-022817 A | 2/2018 |

OTHER PUBLICATIONS

English Translation of Matsubara et al. JPH06302740, obtained from EPO espacenet Dec. 3, 2023 (Year: 2023).*
English translation of International Preliminary Report on Patentability (Chapter I) (Appl. No. PCT/JP2020/011899) dated Nov. 4, 2021, 10 pages.
Japanese Office Action (Application No. 2021-515872) dated Oct. 4, 2022 (with English translation).
International Search Report and Written Opinion (Application No. PCT/JP2020/011899) dated Jun. 16, 2020.

* cited by examiner

METAL MEMBER AND PRODUCTION METHOD THEREFOR

BACKGROUND OF THE INVENTION

Field of the Invention

The present invention relates to a metal member and a manufacturing method therefor, and more particularly to a metal member including a plating layer and a manufacturing method therefor.

Description of the Background Art

Japanese Patent Application Laid-Open No. 2007-243145 discloses a high heat dissipation electronic component housing package. The package includes a heat sink plate, a frame, and an external connection terminal. An upper surface of the heat sink plate and an inner peripheral side wall surface of a frame constitute a cavity for housing an electronic component such as a semiconductor element. In the cavity, the electronic component is mounted on the upper surface of the heat sink plate. The electronic component and the external connection terminal are electrically connected to each other with a bonding wire. With this, attachment of the electronic component to the package completes. Subsequently, with a cover being joined to the package, the electronic component is sealed in the cavity. As a material of the heat sink plate, a material having high thermal conductivity and having a thermal expansion coefficient close to a thermal expansion coefficient of a material of the frame is selected. For example, a copper (Cu)-tungsten (W) composite metal plate, a Cu-molybdenum (Mo) composite metal plate, a Cu/Cu—Mo/Cu joined metal plate in which a copper plate is clad on both surfaces of a Cu—Mo-based metal plate, or the like is used. At the time point before the electronic component is mounted, a nickel (Ni) plating layer and a gold (Au) plating layer are formed on an externally exposed metal surface of the package including the heat sink plate and the external connection terminal.

As described above, a stacked plating including an Ni plating layer and an Au plating layer are formed on the surface of the heat sink plate. A part of the surface of the stacked plating is a mounting surface on which the electronic component is to be mounted. Projections or foreign substances on the mounting surface may give negative influence to connection reliability of the electronic component. In view of this, it is desirable that an inspection for detecting projections or foreign substances on the mounting surface be performed. It is desirable that the inspection be performed with an automatic visual inspection using a camera in mass production. If the mounting surface photographed with a camera has excessive unevenness of a degree of luster, contrast due to the excessive unevenness may be falsely recognized as projections or foreign substances. In particular, a precious metal plating layer such as an Au plating layer usually has high luster, if the layer is flat. Thus, the contrast due to unevenness of luster is liable to be high. Note that the false recognition in the automatic visual inspection does not occur only in the stacked plating on the heat sink plate, but may occur in an inspection of the stacked plating of other metal members as well.

SUMMARY

The present invention is made in order to solve the problem as described above, and has an object to provide a metal member and a manufacturing method therefor that enable reduction of luster unevenness of a precious metal plating layer.

Means to Solve the Problem

A metal member according to the present invention includes a metal substrate, a first intermediate plating layer, a second intermediate plating layer, and a precious metal plating layer. The metal substrate includes a surface constituted of a plurality of crystal grains. The first intermediate plating layer is directly formed on the plurality of crystal grains of the metal substrate, contains a nickel element, and is non-oriented with respect to each crystal orientation of the plurality of crystal grains of the metal substrate. The second intermediate plating layer is directly formed on the first intermediate plating layer. The precious metal plating layer is formed on the second intermediate plating layer.

A manufacturing method for a metal member according to the present invention includes the following steps. A metal substrate including a surface constituted of a plurality of crystal grains is prepared without polishing the surface. A first intermediate plating layer is directly formed on the plurality of crystal grains of the metal substrate using a first plating condition. The first intermediate plating layer contains a nickel element and is non-oriented with respect to each crystal orientation of the plurality of crystal grains of the metal substrate. A second intermediate plating layer containing a nickel element is directly formed on the first intermediate plating layer using a second plating condition different from the first plating condition. A precious metal plating layer is formed on the second intermediate plating layer.

Note that, in this specification, the term "metal" may mean both of pure metal and alloy, unless otherwise specifically limited.

According to the present invention, the first intermediate plating layer non-oriented with respect to each crystal orientation of the plurality of crystal grains of the metal substrate is formed on the surface of the metal substrate. With this configuration, the second intermediate plating layer and the precious metal plating layer formed on the first intermediate plating layer are formed without receiving influence of unevenness of each crystal orientation of the crystal grains constituting the surface of the metal substrate. Thus, growth unevenness of the precious metal plating layer reflecting unevenness of each crystal orientation of the crystal grains constituting the surface of the metal substrate is prevented. Thus, luster unevenness of the precious metal plating layer can be reduced.

These and other objects, features, aspects and advantages of the present invention will become more apparent from the following detailed description when taken in conjunction with the accompanying drawings.

DESCRIPTION OF THE PREFERRED EMBODIMENTS

An embodiment of the present invention will be described below with reference to the drawings.

<Configuration>

Figure 1:
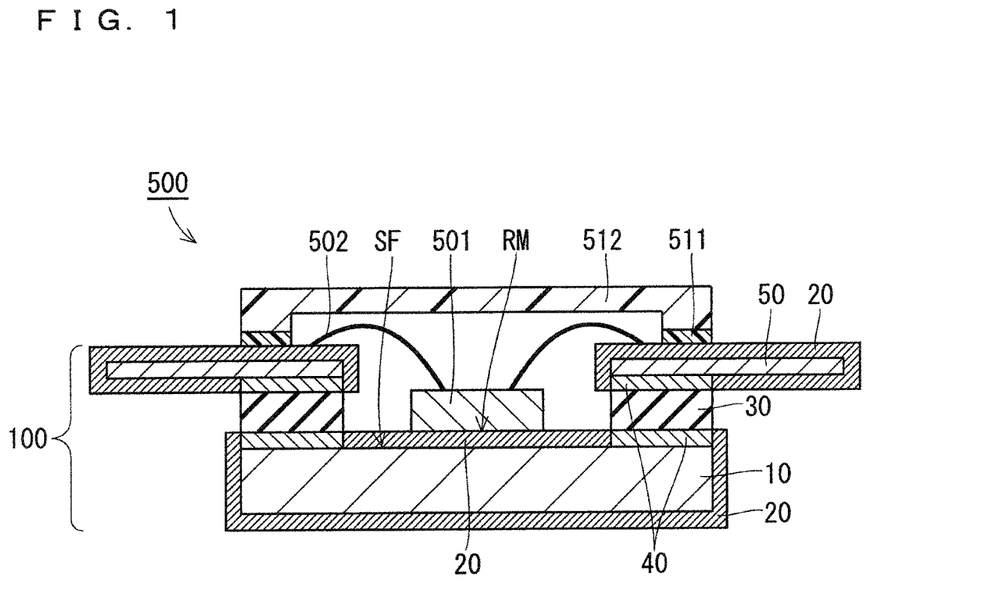
FIG. 1 is a cross-sectional diagram schematically illustrating a configuration of an electronic device according to an embodiment of the present invention.

FIG. 1 is a cross-sectional diagram schematically illustrating a configuration of an electronic device 500 according to the present embodiment. The electronic device 500 includes a package 100, an electronic component 501, a bonding wire 502, a cover 512, and a joining layer 511. The package 100 includes, in its cavity, a mounting surface RM on which the electronic component 501 is to be mounted. The electronic component 501 is mounted on the mounting surface RM. Although the mounting method may be any method, the electronic component 501 and the mounting surface RM may be, for example, joined to each other with a brazing material layer (not illustrated). The bonding wire 502 connects the electronic component 501 and an external connection terminal 50 of the package 100 to each other. The cover 512 is attached to the package 100, and thereby seals the cavity of the package 100. Specifically, the cover 512 and the package 100 are joined to each other with the joining layer 511. The joining layer 511 is, for example, made of an adhesive agent containing resin. The electronic component 501 may be a component with high necessity that is held under an environment having high airtightness, one example of which is a power semiconductor element. The power semiconductor element may be a semiconductor element for high frequency. The semiconductor element for high frequency is a semiconductor element that operates with frequencies of approximately from several tens of megahertz (for example, 30 MHz) to 30 GHz. In this case, the electronic device 500 is a high frequency module. Typical examples of the power semiconductor element appropriate for the high frequency use include a lateral diffused MOS (LDMOS) transistor and a gallium nitride (GaN) transistor.

Figure 2:
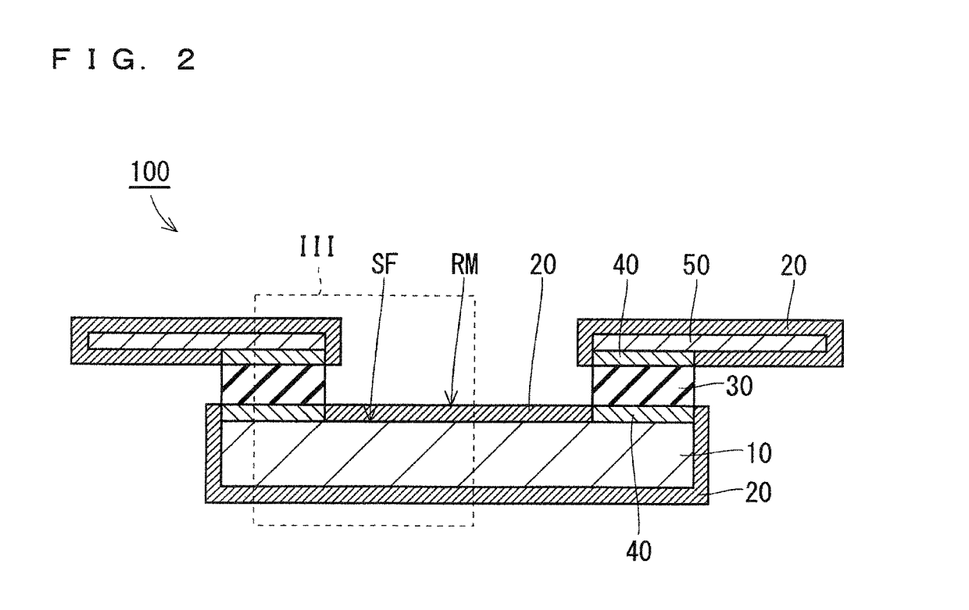
FIG. 2 is a cross-sectional diagram schematically illustrating a configuration of a package used for manufacturing of the electronic device of FIG. 1.

FIG. 2 is a cross-sectional diagram schematically illustrating a configuration of the package 100 used for manufacturing of the electronic device 500 (FIG. 1). The package 100 includes a heat sink plate 10, a frame 30, a lead frame 50 (external connection terminal), a joining layer 40, and a stacked plating 20.

The heat sink plate 10 includes a surface SF (upper surface in FIG. 2). The frame 30 is disposed on the heat sink plate 10 to surround at least a part of the surface SF. The frame 30 is attached to the heat sink plate 10 with the joining layer 40. The lead frame 50 is fixed to the frame 30. The lead frame 50 is attached to the frame 30 by another joining layer 40. The heat sink plate 10 is a single plate or a laminated plate made of metal. It is preferable that the surface SF of the heat sink plate 10 contain a Cu element. In other words, it is preferable that the surface SF be made of Cu or Cu alloy. The stacked plating 20 is formed on a part of the surface having the above-described configuration being made of metal. Thus, the stacked plating 20 includes a part formed on the surface SF of the heat sink plate 10, and the part includes the mounting surface RM.

Figure 3:
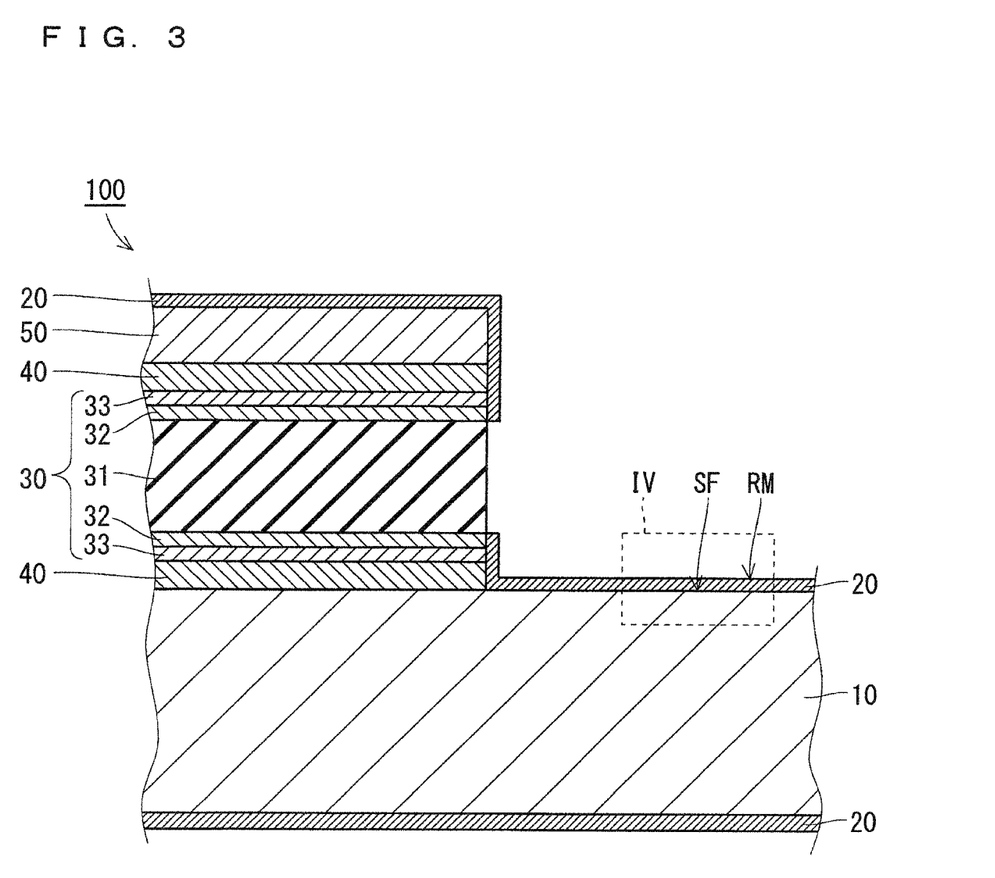
FIG. 3 is a partially enlarged view illustrating a broken-line region III of FIG. 2.

FIG. 3 is a partially enlarged view illustrating a broken-line region III of FIG. 2. The frame 30 includes an insulation frame 31, metallization films 32, and plating films 33.

The insulation frame 31 is made of ceramics. The metallization films 32 are respectively formed on the upper surface and the lower surface of the insulation frame 31. The plating films 33 are respectively formed on the metallization films 32. One metallization film 32 is joined to the heat sink plate 10 with the joining layer 40, and the other metallization film 32 is joined to the lead frame 50 with the joining layer 40. The joining layer 40 is, for example, a brazing material.

Note that a frame made of resin may be used instead of the frame 30 including the insulation frame 31, the metallization films 32, and the plating films 33. In this case, it is preferable that the joining layer 40 be an adhesive agent layer. The frame 30 made of resin and the lead frame 50 may be integrally molded, and in that case, the joining layer 40 between the frame 30 and the lead frame 50 is omitted.

Figure 4:
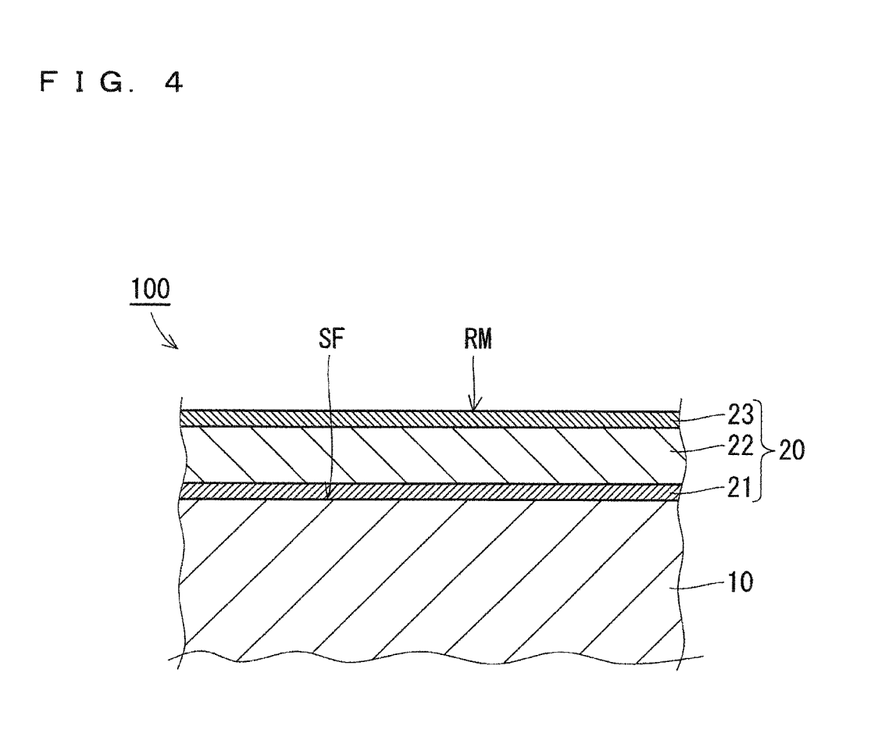
FIG. 4 is a partially enlarged view illustrating a broken-line region IV of FIG. 3.

FIG. 4 is a partially enlarged view illustrating a broken-line region IV of FIG. 3. As described above, the stacked plating 20 is formed on the surface SF of the heat sink plate 10. In this manner, a metal member with the stacked plating having the mounting surface RM is configured. In other words, the metal member includes the heat sink plate 10 (metal substrate) and the stacked plating 20. The stacked plating 20 includes a first intermediate plating layer 21, a second intermediate plating layer 22, and a precious metal plating layer 23. The first intermediate plating layer 21 is directly formed on the surface SF of the heat sink plate 10. The first intermediate plating layer 21 contains a Ni element, examples of which include a Ni plating layer including substantially only Ni, and a Ni—Co alloy plating layer. The second intermediate plating layer 22 is directly formed on the first intermediate plating layer 21. It is preferable that the second intermediate plating layer 22 contain a Ni element, and the second intermediate plating layer 22 may have composition different from composition of the first intermediate plating layer 21. For example, the first intermediate plating layer 21 is made of Ni, and the second intermediate plating layer 22 is made of Ni alloy. The nickel alloy may contain a cobalt (Co) element, one example of which is Ni—Co alloy. The precious metal plating layer 23 is directly or indirectly formed on the second intermediate plating layer 22, and is, in the present embodiment, directly formed thereon. It is preferable that the precious metal plating layer 23 be a gold (Au) layer. As a modification, a layer made of precious metal other than gold, such as a palladium (Pd) layer, may be formed between the Au layer and the second intermediate plating layer 22. The Pd layer has a function of blocking diffusion of Ni atoms into the Au layer. This can prevent color change of the Au layer caused due to diffusion of Ni into the Au layer in a heating process.

Figure 5:
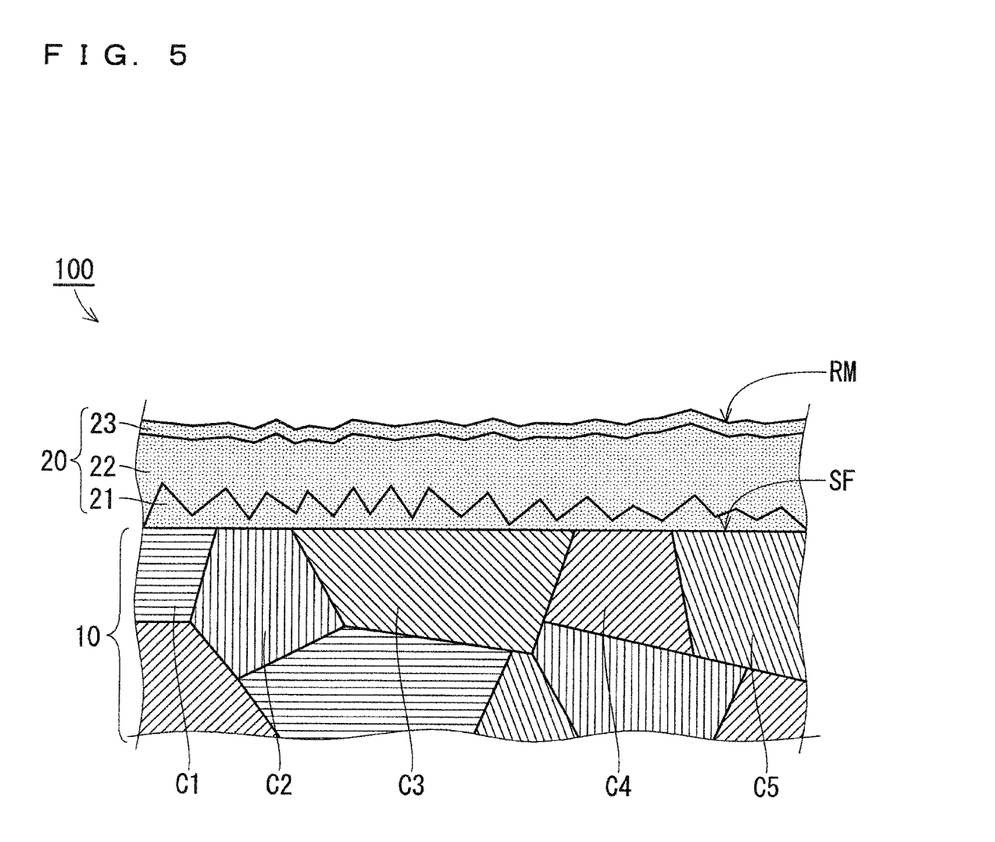
FIG. 5 is a partial cross-sectional diagram schematically illustrating an example of a crystalline state of the configuration illustrated in FIG. 4.

FIG. 5 is a partial cross-sectional diagram schematically illustrating an example of a crystalline state of the configuration illustrated in FIG. 4. In the figure, regarding the heat sink plate 10, crystal grain boundaries thereof are illustrated with bold lines, and crystal orientations thereof are illustrated with thin lines schematically. Regarding the stacked plating 20, illustration of crystal grain boundaries is omitted.

The heat sink plate 10 includes the surface SF that is constituted of a plurality of crystal grains including crystal grains C1 to C5 illustrated in the figure. Note that, in the following description, a large number of crystal grains constituting the surface SF may be referred to as the crystal grains C1 to C5 as an example. The surface SF of the heat sink plate 10 may be a non-polished surface. In other words, the surface SF may be a surface of the heat sink plate 10 immediately after being formed (i.e. an as-grown surface), such as a cast surface or a sintered surface. With the surface SF of the heat sink plate 10 not being polished, a Beilby layer is not formed on the surface SF. The crystal grains C1 to C5 have a first average crystal grain diameter in the in-plane direction (in the figure, the horizontal direction).

The first intermediate plating layer 21 is directly formed on the crystal grains C1 to C5 of the heat sink plate 10. The first intermediate plating layer 21 is substantially non-oriented with respect to the crystal grains C1 to C5 of the heat sink plate 10. Specifically, the first intermediate plating layer 21 is substantially non-oriented with respect to each crystal orientation of the crystal grains C1 to C5 of the heat sink plate 10. The crystal grains of the first intermediate plating layer 21 have a second crystal grain diameter smaller than the first average crystal grain diameter in the in-plane direction. In other words, the average crystal grain diameter of the first intermediate plating layer 21 is smaller than the average crystal grain diameter of the heat sink plate 10 at positions to face the surface SF.

Note that the average crystal grain diameter may be calculated with the method of sections. Specifically, the average crystal grain diameter may be calculated as follows: a line segment of a known length completely crossing 10 to 50 crystal grains is drawn on an image or a photograph of a microscope, and the known length is divided by the number of these crystal grains.

It is preferable that surface roughness of the surface (in the figure, the upper surface) of the first intermediate plating layer 21 be coarse to a certain degree. The surface roughness has, for example, a maximum height Ry of 0.3 μm or more. With this configuration, the crystal grain diameter of the second intermediate plating layer 22 can be easily reduced. Further, as a result of selecting a plating condition that the first intermediate plating layer 21 becomes non-oriented, the surface roughness of the first intermediate plating layer 21 may be liable to be increased. Provided that the precious metal plating layer 23 is formed directly on the coarse surface as described above, to obtain a uniform precious metal plating layer 23, a large thickness is required. Precious metal, in particular Au, is expensive, which thus leads to increase of material costs. Thus, in the present embodiment, the precious metal plating layer 23 is formed on the first intermediate plating layer 21, with the second intermediate plating layer 22 being interposed therebetween. It is preferable that the surface roughness of the second intermediate plating layer 22 be smaller than the surface roughness of the first intermediate plating layer 21. Note that, the maximum height Ry refers to a height obtained by extracting only a reference length from a roughness curve in a direction of an average line, and measuring an interval between a top line and a bottom line in the extracted part in a direction of longitudinal magnification of the roughness curve. The reference length may approximately be the view (for example) illustrated in FIG. 5.

As described above, the first intermediate plating layer 21 is substantially non-oriented with respect to the crystal grains C1 to C5 of the heat sink plate 10. Specifically, the first intermediate plating layer 21 is substantially non-oriented with respect to each crystal orientation of the crystal grains C1 to C5 of the heat sink plate 10. This means that information of the crystal orientations of the surface of the heat sink plate 10 is substantially lost in the surface (in the figure, the upper surface) of the first intermediate plating layer 21. As a result, the second intermediate plating layer 22 grows without substantially receiving the difference of the crystal orientations among the plurality of crystal grains of the heat sink plate 10.

The thickness of the first intermediate plating layer 21 is preferably 0.3 μm or more, more preferably 1.0 μm or more, and 2 μm or less is usually sufficient. The interface between the first intermediate plating layer 21 and the second intermediate plating layer 22 can be identified in many cases through crystal orientation observation and composition observation.

<Manufacturing Method>

Figure 6:
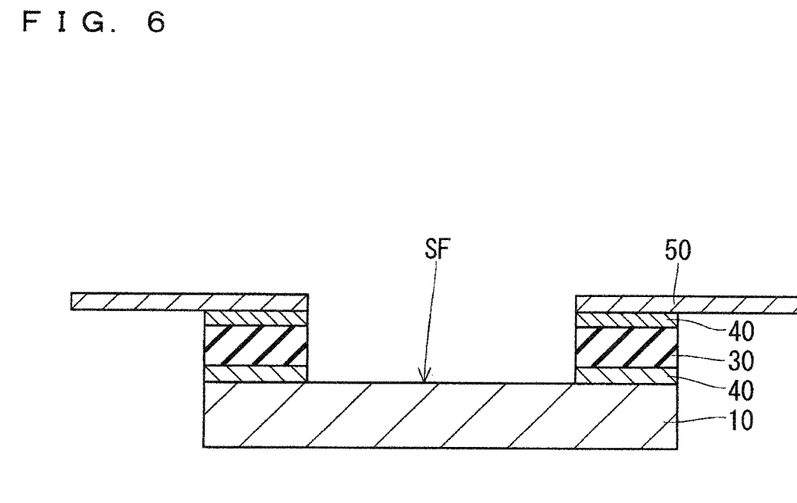
FIG. 6 is a cross-sectional diagram schematically illustrating a process of a manufacturing method of the package of FIG. 2.

FIG. 6 is a cross-sectional diagram schematically illustrating a process of the manufacturing method of the package 100 (FIG. 2). First, the heat sink plate 10, the frame 30, and the lead frame 50 are prepared. The heat sink plate 10 can be, for example, formed by one or in combination of casting and sintering. The surface SF of the heat sink plate 10 formed in this manner need not be polished. In other words, the heat sink plate 10 having the surface SF constituted of a plurality of crystal grains may be prepared without having its surface SF being polished. Next, these members are joined to each other with the joining layer 40. In this manner, the configuration illustrated in the figure is obtained.

FIG. 5 is referred to again. Next, the first intermediate plating layer 21 containing a Ni element is directly formed on the crystal grains C1 to C5 of the heat sink plate 10, using a first plating condition. The first plating condition is selected in such a manner that the first intermediate plating layer 21 is non-oriented with respect to the crystal grains C1 to C5 of the heat sink plate 10. Specifically, the first plating condition is selected in such a manner that the first intermediate plating layer 21 is non-oriented with respect to each crystal orientation of the crystal grains C1 to C5 of the heat sink plate 10.

Next, the second intermediate plating layer 22 containing a Ni element is directly formed on the first intermediate plating layer 21, using a second plating condition different from the first plating condition. The second plating condition can be selected without the restriction being imposed on the first plating condition. In order to implement a plating process of the precious metal plating layer 23 to be described later uniformly with a smaller thickness, it is preferable that the second plating condition be a condition that the surface roughness becomes smaller than the first plating condition. Next, the precious metal plating layer 23 is formed on the second intermediate plating layer 22. With this, the package 100 is obtained.

<Comparative Examples>

Figure 7:
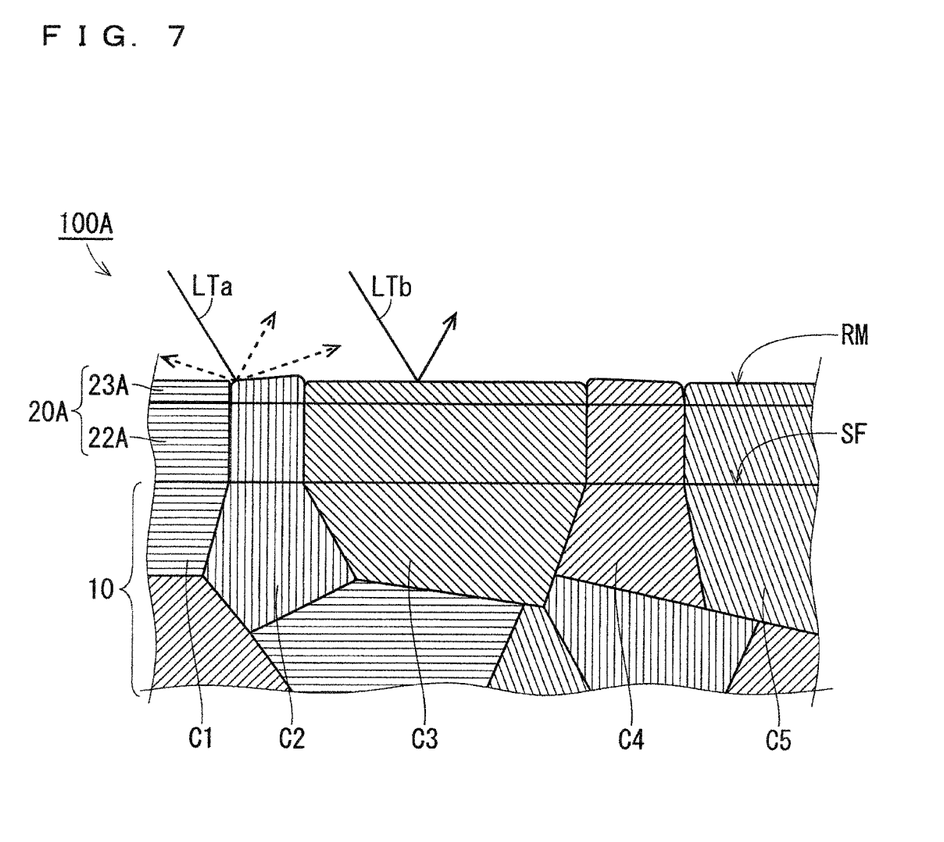
FIG. 7 is a partial cross-sectional diagram schematically illustrating a state of light reflection on a mounting surface in a package according to a first comparative example.

FIG. 7 is a partial cross-sectional diagram schematically illustrating a state of light reflection on the mounting surface RM in a package 100A according to a comparative example. The package 100A is manufactured by forming a second intermediate plating layer 22A and a precious metal plating layer 23A without forming the first intermediate plating layer 21. The second intermediate plating layer 22A is not separated from the surface SF by the non-oriented first intermediate plating layer 21 (FIG. 5), and thus grows receiving influence of unevenness of the crystal grains C1 to C5 constituting the surface SF of the heat sink plate 10. Specifically, the second intermediate plating layer 22A grows receiving influence of unevenness of each crystal orientation of the crystal grains C1 to C5 constituting the surface SF of the heat sink plate 10. Thus, the precious metal plating layer 23A formed on the second intermediate plating layer 22A also grows receiving influence of the unevenness of the crystal grains C1 to C5. Specifically, the precious metal plating layer 23A formed on the second intermediate plating layer 22A also grows receiving influence of the unevenness of each crystal orientation of the crystal grains C1 to C5. As a result, the mounting surface RM of the surface SF has a part where relatively small crystal grains gather, and a part where large crystal grains occupy. Reflected light of incident light LTa entering the former part is relatively easily diffused. In contrast, reflected light of incident light LTb entering the latter part is relatively easily intensified. As a result, luster unevenness of the precious metal plating layer 23A is increased.

Figure 8:
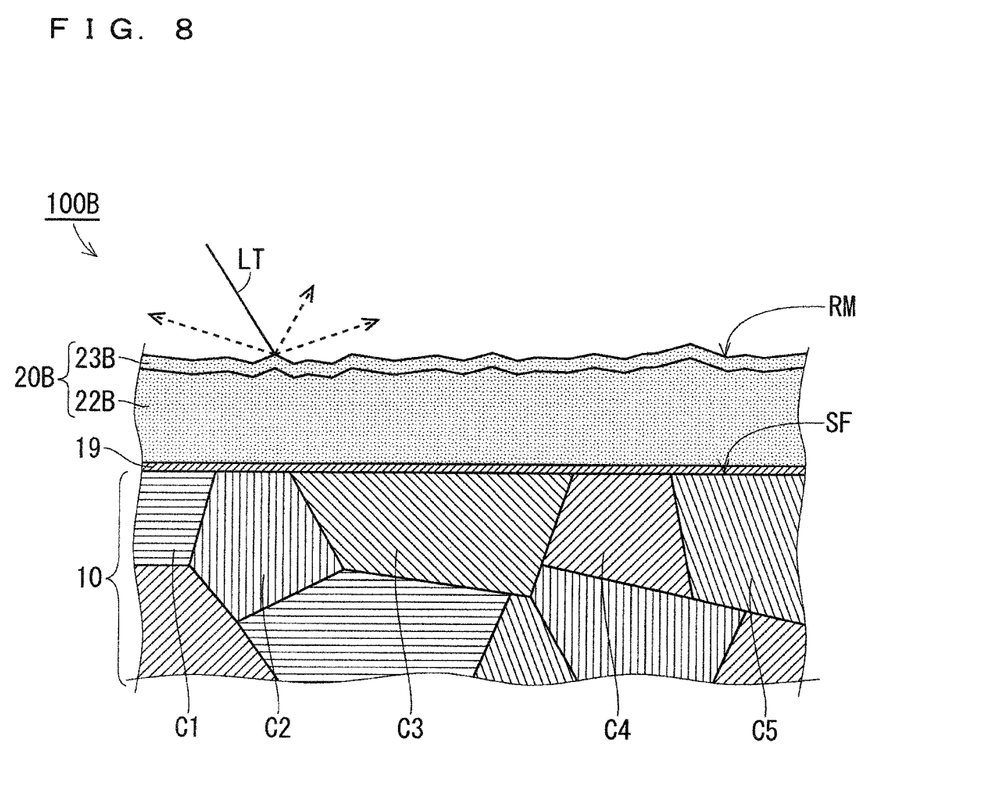
FIG. 8 is a partial cross-sectional diagram schematically illustrating a state of light reflection on a mounting surface in a package according to a second comparative example.

FIG. 8 is a partial cross-sectional diagram schematically illustrating a state of light reflection on the mounting surface RM in a package 100B according to a comparative example. Note that, similarly to FIG. 5, crystal grain boundaries of the heat sink plate 10 are illustrated, while illustration of crystal grain boundaries of a stacked plating 20B is omitted.

The package 100B is manufactured by forming a Beilby layer 19 instead of the first intermediate plating layer 21 (FIG. 5), and then forming a second intermediate plating layer 22B and a precious metal plating layer 23B. The Beilby layer 19 is formed by polishing the surface SF. The second intermediate plating layer 22B is separated from the surface SF by the Beilby layer 19, and thus grows without receiving influence of unevenness of the crystal grains C 1 to CS constituting the surface SF of the heat sink plate 10. Specifically, the second intermediate plating layer 22B grows without receiving influence of unevenness of each crystal orientation of the crystal grains C1 to C5 constituting the surface SF of the heat sink plate 10. Thus, the precious metal plating layer 23B formed on the second intermediate plating layer 22B also grows without receiving influence of the unevenness of the crystal grains C1 to C5. Specifically, the precious metal plating layer 23B formed on the second intermediate plating layer 22B also grows without receiving influence of the unevenness of each crystal orientation of the crystal grains C1 to C5. As a result, a dispersion state of reflected light of incident light LT easily becomes uniform. Thus, in comparison to the precious metal plating layer 23A of the package 100A (FIG. 7), luster unevenness of the precious metal plating layer 23B can be reduced. However, the present comparative example requires a polishing process for forming the Beilby layer 19. The polishing process imposes a large load in manufacturing.

<Effects>

Figure 9:
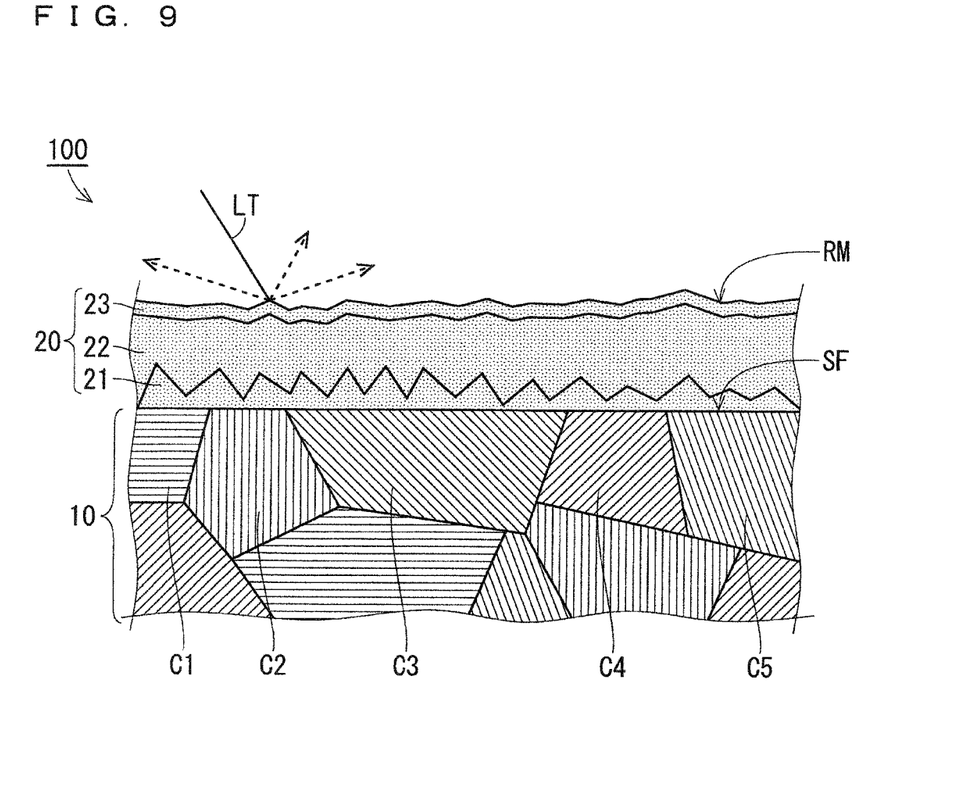
FIG. 9 is a partial cross-sectional diagram schematically illustrating a state of light reflection on a mounting surface in a package of FIG. 5.

FIG. 9 is a partial cross-sectional diagram schematically illustrating a state of light reflection on the mounting surface RM in the package 100 according to the present embodiment. According to the present embodiment, the first intermediate plating layer 21 non-oriented with respect to the crystal grains C1 to C5 is formed on the surface SF of the heat sink plate 10. Specifically, the first intermediate plating layer 21 non-oriented with respect to each crystal orientation of the crystal grains C1 to C5 is formed on the surface SF of the heat sink plate 10. With this configuration, the second intermediate plating layer 22 and the precious metal plating layer 23 formed on the first intermediate plating layer 21 are formed without receiving influence of the unevenness of the crystal grains C1 to C5 constituting the surface SF of the heat sink plate 10. Specifically, the second intermediate plating layer 22 and the precious metal plating layer 23 formed on the first intermediate plating layer 21 are formed without receiving influence of the unevenness of each crystal orientation of the crystal grains C1 to C5 constituting the surface SF of the heat sink plate 10. Thus, growth unevenness of the precious metal plating layer 23 reflecting the unevenness of the crystal grains C1 to C5 is prevented. Specifically, growth unevenness of the precious metal plating layer 23 reflecting the unevenness of each crystal orientation of the crystal grains C1 to C5 is prevented. As a result, a dispersion state of reflected light of incident light LT easily becomes uniform. Thus, luster unevenness of the precious metal plating layer 23 can be reduced.

Projections or foreign substances on the mounting surface RM may give negative influence to connection reliability of the electronic component 501 (FIG. 1). In view of this, it is desirable that an inspection for detecting projections or foreign substances be performed on the mounting surface RM before a mounting process. It is desirable that the inspection be performed with an automatic visual inspection using a camera in mass production. If the mounting surface RM has excessive unevenness of a degree of luster when being photographed with a camera, contrast due to the excessive unevenness may be falsely recognized as projections or foreign substances. In particular, a precious metal plating layer such as an Au plating layer usually has high luster, if the layer is flat. Thus, the contrast due to unevenness of luster is liable to be high. According to the present embodiment, in an inspection of the mounting surface RM, false recognition due to luster unevenness can be prevented for the reason described above.

The crystal grains C1 to C5 (FIG. 9) has the first average crystal grain diameter in the in-plane direction (in the figure, the horizontal direction), and the crystal grains (not illustrated) of the first intermediate plating layer 21 have the second crystal grain diameter smaller than the first average crystal grain diameter in the in-plane direction. With this configuration, the crystal grain diameter of the crystal grains (not illustrated) of the second intermediate plating layer 22 and the precious metal plating layer 23 formed on the first intermediate plating layer 21 can be easily reduced. Thus, locally intense light reflection from large crystal grains of the precious metal plating layer 23 is less liable to be caused. Thus, luster unevenness of the precious metal plating layer 23 can further be reduced.

The surface SF of the heat sink plate 10 may be a non-polished surface. This eliminates the need of a surface polishing process of the heat sink plate 10. The polishing process is a process that requires much labor, and thus by omitting the polishing process, the manufacturing method of the heat sink plate 10 can be simplified. Note that, when the surface SF of the heat sink plate 10 is a non-polished surface, the Beilby layer 19 (FIG. 8) is not formed on the surface SF.

It is preferable that the second intermediate plating layer 22 contain a Ni element. With this configuration, the second intermediate plating layer 22 can be formed inexpensively as compared to the precious metal plating layer.

The first intermediate plating layer 21 is required to be non-oriented with respect to the crystal grains C1 to C5 of the heat sink plate 10, and thus it is preferable that composition appropriate therefor be selected. Specifically, the first intermediate plating layer 21 is required to be non-oriented with respect to each crystal orientation of the crystal grains C1 to C5 of the heat sink plate 10, and thus it is preferable that composition appropriate therefor be selected. In contrast, the second intermediate plating layer 22 is not subjected to such a restriction, and thus composition different from the composition of the first intermediate plating layer 21 can be more freely selected. For example, the first intermediate plating layer 21 is made of Ni, and the second intermediate plating layer 22 is made of Ni alloy. The Ni alloy may contain a Co element.

It is preferable that the surface SF of the heat sink plate 10 contain a Cu element. With this, thermal conductivity of the surface SF of the heat sink plate 10 can be enhanced.

<Experiment>

The following shows manufacturing conditions of packages Nos. 1 to 5, and results of an automatic visual inspection carried out on the mounting surface RM of the packages.

Note that the above describes a case in which the metal substrate is the heat sink plate of the package. However, the metal substrate is not limited to this. The metal substrate may be, for example, a metal frame for a package. The metal frame constitutes a side surface of the cavity of the package, and a support part that supports the frame constitutes a bottom surface of the cavity. In this case, in the visual inspection of the surface of the metal frame performed before a process of attaching the cover to the metal frame, false recognition can be prevented. When the support part is made of ceramics, it is desirable that the thermal expansion coefficient of the metal frame be close to the thermal

TABLE 1

| | | | STACKED PLATING | | | | |
|---|---|---|---|---|---|---|---|
| | | | ROUGHENED Ni PLATING LAYER | | NiCo PLATING | Au PLATING LAYER | |
| | No. | SURFACE OF HEAT SINK | THICKNESS (μm) | SURFACE ROUGHNESS Ry (μm) | LAYER THICKNESS (μm) | THICKNESS (μm) | DEGREE OF LUSTER | AUTOMATIC VISUAL INSPECTION |
| WORKING EXAMPLE | 1 | WITHOUT POLISHING | 1.0 | 0.35 | 6 | 0.8 | 0.45 | NORMAL |
| | 2 | | 1.5 | 0.40 | | | 0.40 | NORMAL |
| | 3 | | 2.0 | 0.45 | | | 0.35 | NORMAL |
| COMPARATIVE EXAMPLE | 4 | | — | — | | | 1.0 OR MORE | FALSE RECOGNITION |
| | 5 | WITH POLISHING | — | — | | | LESS THAN 1.0 | NORMAL |

Note that each of No. 1 to No. 3 corresponds to the package 100 (FIG. 9) as a working example, No. 4 corresponds to the package 100A (FIG. 7) as a comparative example, and No. 5 corresponds to the package 100B (FIG. 8) as a comparative example.

In any of No. 1 to No. 5, a Cu/Cu—Mo/Cu joined metal plate was used as the heat sink plate. In No. 1 to No. 4, this was used without being polished. In No. 5, a Cu surface on the mounting surface side was polished, and the Beilby layer 19 (FIG. 8) was thereby formed. Using these heat sink plates, a configuration before plating was prepared (see FIG. 6).

In No. 1 to No. 3, a roughened Ni plating layer being an Ni plating layer having a roughened surface was formed as the first intermediate plating layer 21 (FIG. 9). Note that the roughened Ni plating layer can be obtained by adjusting a plating condition, a chemical solution component, or the like. The average thickness of the first intermediate plating layer 21 in each of No. 1 to No. 3 was 1.0 μm, 1.5 μm, and 2.0 μm, respectively. In No. 4 and No. 5, the formation was omitted. Next, an NiCo plating layer was formed using a regular plating method. Next, an Au plating layer was formed using a regular plating method.

The degree of luster of the mounting surface including the Au plating layer was measured, and the results shown in the table were obtained. Note that, as a measurement device for the degree of luster, VSR-300A manufactured by NIPPON DENSHOKU INDUSTRIES Co., Ltd. was used. As a measurement method, the Black mode of the device was used.

The automatic visual inspection of the mounting surface was performed. As a result, in No. 1 to No. 3 and No. 5, the inspection was performed normally; however, false recognition occurred in No. 4. Specifically, in No. 4, a locally dark part was falsely recognized as foreign substances. It is considered that such false recognition was liable to be caused because No. 4 had a high degree of luster of 1.0 or more and the contrast of the image acquired by a camera was high.

expansion coefficient of the ceramics. In view of this, as a material of the metal frame, for example, for example, iron (Fe)—Ni-based alloy or Fe—Ni—Co-based alloy is used.

While the invention has been shown and described in detail, the foregoing description is in all aspects illustrative and not restrictive. It is therefore understood that numerous unillustrated modifications can be devised without departing from the scope of the present invention.

What is claimed is:
1. A metal member comprising:
    a metal member having a mounting surface on which an electronic component is to be mounted, comprising:
        a metal substrate being a heat sink plate, including a surface constituted of a plurality of crystal grains;
        a first intermediate plating layer being directly formed on the plurality of crystal grains of the metal substrate, containing a nickel element, and being non-oriented with respect to each crystal orientation of the plurality of crystal grains of the metal substrate;
        a second intermediate plating layer being directly formed on the first intermediate plating layer; and
        a precious metal plating layer being formed on the second intermediate plating layer;
    a package-frame disposed on the heat sink plate and;
    a lead frame fixed to the package-frame; and
    wherein the electronic component is a power semiconductor element.
2. The metal member according to claim 1, wherein the plurality of crystal grains of the metal substrate has a first average crystal grain diameter in an in-plane direction, and the first intermediate plating layer has a second crystal grain diameter smaller than the first average crystal grain diameter in the in-plane direction.
3. The metal member according to claim 1, wherein the surface of the metal substrate is a non-polished surface.

4. The metal member according to claim 1, wherein
a Beilby layer is not formed in the surface of the metal substrate.

5. The metal member according to claim 1, wherein
the second intermediate plating layer contains a nickel element.

6. The metal member according to claim 1, wherein
the second intermediate plating layer has composition different from composition of the first intermediate plating layer.

7. The metal member according to claim 1, wherein
the first intermediate plating layer is made of nickel, and the second intermediate plating layer is made of nickel alloy.

8. The metal member according to claim 7, wherein
the nickel alloy contains a cobalt element.

9. The metal member according to claim 1, wherein
the surface of the metal substrate contains a copper element.

10. The package according to claim 1, wherein the precious metal plating layer includes a gold layer.

11. The package according to claim 1, wherein the precious metal plating layer includes a palladium layer.

12. The package according to claim 1, wherein
the first intermediate plating layer has a surface roughness having a maximum height Ry of 0.3 µm or more.

13. The package according to claim 1, wherein
the first intermediate plating layer has polycrystalline structure.

14. A manufacturing method for manufacturing the package according to claim 1, comprising
preparing the metal substrate without polishing the surface of the metal substrate;
forming the first intermediate plating layer using a first plating condition;
forming the second intermediate plating layer containing a nickel element on the first intermediate plating layer using a second plating condition different from the first plating condition; and
forming the precious metal plating layer on the second intermediate plating layer.

* * * * *